United States Patent
Dishongh et al.

(10) Patent No.: US 6,452,502 B1
(45) Date of Patent: Sep. 17, 2002

(54) METHOD AND APPARATUS FOR EARLY DETECTION OF RELIABILITY DEGRADATION OF ELECTRONIC DEVICES

(75) Inventors: Terrance J. Dishongh, Hillsboro; David H. Pullen; Gregory F. Taylor, both of Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/345,583

(22) Filed: Jun. 30, 1999

Related U.S. Application Data

(63) Continuation-in-part of application No. 09/173,513, filed on Oct. 15, 1998, now Pat. No. 6,094,144.

(51) Int. Cl.⁷ .............................................. G08B 21/00
(52) U.S. Cl. ..................... 340/653; 340/661; 340/635; 340/652; 257/48; 228/104
(58) Field of Search ................................ 340/653, 652, 340/635, 661; 228/103, 104; 257/48

(56) References Cited

U.S. PATENT DOCUMENTS

| | | | |
|---|---|---|---|
| 4,288,694 A | 9/1981 | Ahrons | 250/374 |
| 4,672,849 A | 6/1987 | Hoshino | 73/579 |
| 5,057,775 A | 10/1991 | Hall | 324/158 R |
| 5,493,775 A * | 2/1996 | Darekar et al. | 29/840 |
| 5,651,493 A * | 7/1997 | Bielick et al. | 228/105 |
| 5,670,821 A | 9/1997 | Bowers | 257/547 |
| 5,754,060 A | 5/1998 | Nguyen et al. | 326/86 |
| 5,844,249 A | 12/1998 | Takano et al. | 250/559.34 |

* cited by examiner

*Primary Examiner*—Jeffery Hofsass
*Assistant Examiner*—Sihong Huang
(74) *Attorney, Agent, or Firm*—Blakely, Sokoloff, Taylor & Zafman LLP

(57) ABSTRACT

A circuit that senses changes in the electrical characteristics of one or more solder joints, and generates one or more signals based, at least in part, on the electrical characteristics that are sensed, is incorporated into an integrated circuit. In a further aspect of the present invention, the one or more signals generated by the circuit are indicative of the reliability of the solder joints. Embodiments of the present invention provide a warning in advance of system failure, permitting repair or replacement of a failing unit/joint before a failure becomes catastrophic. Embodiments of the present invention include structures and circuitry that can determine whether solder joint failure has occurred, and that can communicate the occurrence of solder joint failure to other components or systems.

28 Claims, 2 Drawing Sheets

METHOD AND APPARATUS FOR EARLY DETECTION OF RELIABILITY DEGRADATION OF ELECTRONIC DEVICES

This application is a continuation-in-part of prior application No. 09/173,513 filed on Oct. 15, 1998 is now U.S. Pat. No. 6,094,144 which was issued on Jul. 25, 2000.

BACKGROUND OF THE INVENTION

1. Field of the Invention

The invention relates to the packaging of electronic devices, and more particularly to determination of reliability degradation.

2. Background

Advances in semiconductor manufacturing technology have led to the integration of millions of circuit elements, such as transistors, on a single integrated circuit (IC). As a direct result of incorporating more circuit elements on ICs, the level of functionality of these ICs has increased dramatically. Consequently, there has been a greater need for input/output (I/O) terminals with which to communicate with the additional circuitry on complex logic devices such as, for example, microprocessors.

I/O terminals were traditionally formed by way of metal pads along the periphery of an IC. These pads were then electrically connected to conductive pathways on a package by wires. Such wires, typically made of gold, have been referred to as bond wires, and the process of connecting the pads to the package has been referred to as wire bonding.

For many years wire bonding the pads, which were formed along the periphery of an IC, to connection points on a package was adequate to service the required number of I/O terminals. However, as the number of required I/O terminals reached into the hundreds, a form of I/O connection that allowed substantially the whole surface of an IC, and not only the periphery, to be available for I/O connections became popular. This form of I/O connection is known in the industry as controlled collapse chip connection, or C4. The expression "flip chip" has also been used to refer to the C4 I/O connection structures and methods.

Integrated circuits having a controlled collapse chip connection I/O configuration typically have hundreds of terminals, often referred to as bumps, or solder bumps, that are formed on the surface of the IC. The solder bumps are coupled to conductive material in the IC so that signals can be communicated between the IC and components that are external to the IC. The conductive material is generally a metal, such as aluminum or copper, and this metal is further interconnected with other metal lines or interconnect structures of the IC. After the bumps are formed on the IC, they are mated to corresponding connection points in a package. Subsequently, a material, such as an epoxy, is used to fill the gaps between the bumps to complete the assembly process.

The package and the integrated circuit tend expand at different rates when heated. This mismatch introduces mechanical stresses that can result in failure of the solder bumps of the integrated circuit. Both cracking and delamination are known reliability problems. These problems occur more frequently when the differences in thermal expansion rates are larger rather than smaller. For example, the difference in thermal expansion rates between integrated circuits formed in silicon substrates and mated to ceramic packages is less than the difference between those ICs that are mated to organic land grid array packages.

Similarly, integrated circuit packages, such as ball grid array (BGA) packages, are attached to substrates, such as printed circuit boards, by solder balls. These solder balls, essentially larger versions of the solder bumps that are used to attach the integrated circuit die to the package, suffer from the same type of mechanical stresses that are encountered by the solder bumps, and hence are subject to similar failure mechanisms.

What is needed are methods and apparatus for non-destructively determining if the reliability of a solder connection has been degraded.

SUMMARY OF THE INVENTION

Briefly, a circuit that senses changes in the electrical characteristics of one or more solder joints, and generates one or more signals based, at least in part, on the electrical characteristics that are sensed, is incorporated into an integrated circuit.

In a further aspect of the present invention, the one or more signals generated by the circuit are indicative of the reliability of solder joints.

DETAILED DESCRIPTION

Overview

Figure 1:
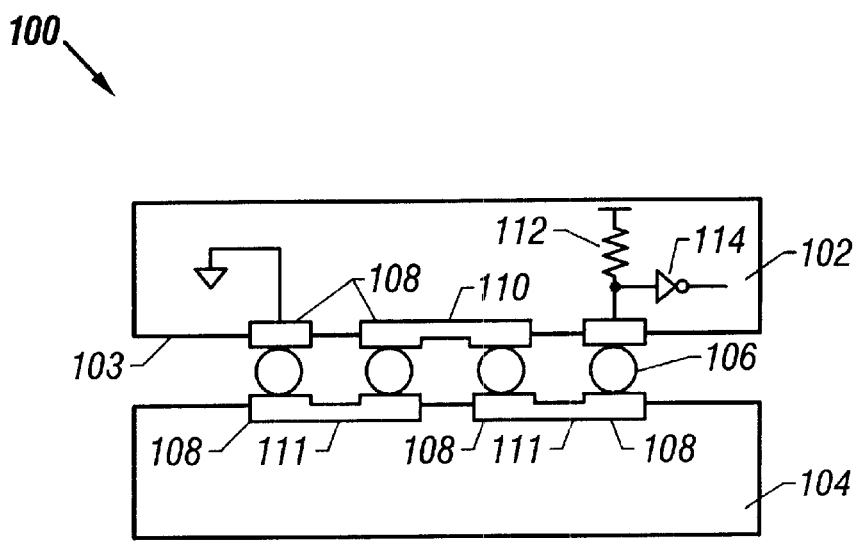
FIG. 1 is a schematic cross-section of an integrated circuit having C4 I/O terminals mated to a package substrate.

System reliability is an important aspect of modern electronic systems. Presently, the failure of solder joints in electronic systems can only be predicted statistically, making it difficult to guarantee that a system that contains many soldered components will not fail unexpectedly. By providing an advance warning that some solder joints have started to fail, embodiments of the present invention permit replacement of system components with impending failures before a functional failure actually occurs.

Embodiments of the present invention can sense solder joint failure or degradation in the integrity of the solder joints. Embodiments of the present invention may be referred to as solder joint fatigue monitors. By providing information on the status of the integrity of the solder joints in an electronic assembly, the present invention facilitates maintenance of electronic systems, as well as failure analysis.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling or interconnecting, electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor body is considered, for the purpose of describing illustrative embodiments of the present invention, the FET will be described using the traditional gate-drain-source, three terminal model.

The term vertical, as used herein, means substantially perpendicular to th e surface of a substrate.

When a logical signal name herein includes "#" as a suffix, then that signal is low active. That is, the signal goes to a logical low state when it is asserted, and goes to a logical high state when it is deasserted.

FIG. 1 shows a cross section of a packaged integrated circuit attached to a printed circuit board in accordance with the invention. Referring to FIG. 1, an assembly 100 includes an integrated circuit package 102 with I/O terminals attached to a printed circuit board 104. Assembly 100 includes an integrated circuit (not shown) within the body of package 102. Typically, although not required to be, the integrated circuit is formed from a silicon substrate. Integrated circuit package 102 has a first surface 103 adapted to make electrical contact with printed circuit board 104. Those skilled in the art will recognize that integrated circuit package 102 has a plurality of conductive paths therethrough for interconnecting the integrated circuit with printed circuit board 104. Integrated circuit package 102 and printed circuit board 104 are attached by solder balls 106. In this way electrical connection is established between the integrated circuit and printed circuit board 104. The region where connection is established between the IC package and the board may be referred to as an attachment interface.

Still referring to FIG. 1, it can be seen that solder balls 106 are coupled to integrated circuit package 102 and printed circuit board 104 at contact areas 108. Various contact areas 108 of integrated circuit package 102 are electrically connected to each other by package traces 110. Similarly, various contact areas 108 of printed circuit board 104 are electrically connected to each other by board traces 111. The interconnected solder balls 106, package traces 110, and board traces 111 make up a solder joint test chain. A resistor 112 and an inverter 114 are shown schematically as being coupled to one end of the solder joint test chain. The opposite end of the solder joint test chain is further provided with a connection, which in operation is coupled to a ground node. Taken together, these interconnections and circuit elements represent a simple implementation of circuitry that can be used to detect a problem such as solder ball cracking, or other solder joint failure mechanisms.

In order to detect a failed solder joint, several solder joints are connected in series, with one end of this solder joint test chain tied to ground and the other end tied to a power supply through a pull up device (a resistor is shown in FIG. 1). It will be appreciated that any suitable current source, whether active or passive, may be used in place of the resistor that is shown in FIG. 1. Embodiments of the present invention may use a switchable conductive pathway, such as that provided by a transistor, so that the current path may be turned off to reduce power consumption. In operation, the voltage at the end of the solder joint test chain that is tied to the pull up device is sensed, in the illustrative embodiment of FIG. 1, by inverter 114. If all of the solder joints are intact then this end of the chain will have a voltage close to ground and will therefore be seen as a logical zero by inverter 114. If any of the solder joints are open, then the voltage on the pull up end of the solder joint test chain will be higher than ground and therefore will be seen as a logical high by inverter 114.

Figure 2:
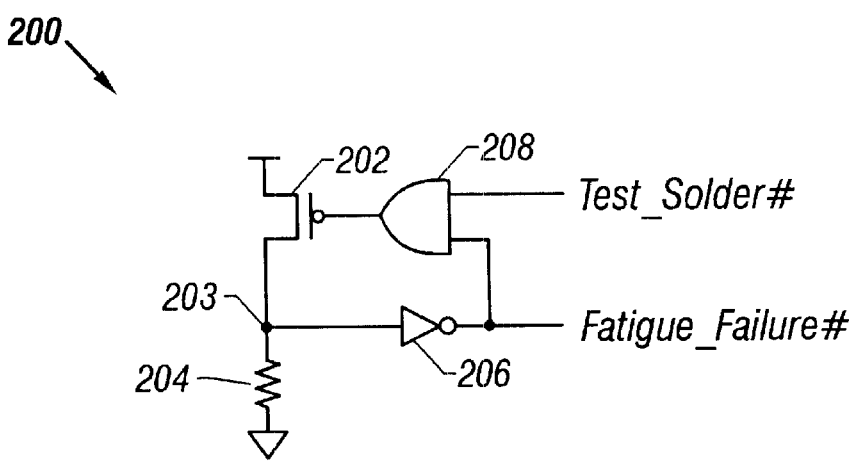
FIG. 2 is a schematic diagram showing a logic circuit coupled to a solder fatigue test chain in accordance with an embodiment of the present invention.

FIG. 2 is a schematic diagram of an illustrative circuit 200 that pulls up the solder joint test chain and senses the voltage at one end to determine if the solder joint test chain is intact. A PFET 202 is coupled source-to-drain between a power supply node and an intermediate node 203. As shown in the figure, the solder joint test chain is represented as a resistor 204. Resistor 204 is coupled between intermediate node 203 and a ground node. An inverter 206 has an input terminal coupled to intermediate node 203. An AND gate 208 has an output terminal coupled to the gate of PFET 202; a first input terminal coupled to an output terminal of inverter 206; and a second input terminal coupled to control signal source. If all of the solder joints are intact, then the resistance of the solder joint test chain, represented by resistor 204, will be very low (effectively zero). If any of the joints have failed, then this resistance will become significantly larger and, consequently, PFET 202 will continue to supply charge so as to pull up the voltage at node 203.

Note that increasing the size, i.e., the current sourcing capability, of PFET 202 will allow more current to flow through the solder joint test chain, thereby decreasing the amount of resistance that is required to result in the indication of a failure. However, increasing the current sourcing capability of PFET 202 can result in increased power consumption when the solder joint test chain is intact and being tested. To reduce this power consumption, circuit 200 is coupled to a control signal source "Test_solder#." When this control signal is low, PFET 202 is turned on and current flows through the solder joint test chain. If there is an open in the chain, then the voltage at intermediate node 203 will rise, resulting in the output of inverter 206 (labeled "Fatigue_failure#" in FIG. 2) will go to a logical low level, otherwise the output of inverter 206 is high. If the control signal "Test_solder#" is high, then PFET 202 is turned off, current does not flow through the solder joint test chain, and consequently no power is consumed. In the event of a solder joint failure, AND gate 208 keeps PFET 202 turned on even after control signal "Test_solder#" has gone high, thereby maintaining the output of inverter 206 (i.e., "Fatigue_failure#") at a logical low level.

Circuit 200 allows the solder joints to be tested periodically to save power. This can be driven by a clock (e.g., test once a day), a thermal sensor (e.g., test when the temperature rises from less than 30° C. to more than 40° C.), or by a power management subsystem (e.g., test whenever the part leaves a low power state).

The output of inverter 206 ("Fatigue_Failure#" ) can be coupled to other circuitry. In that way, the state of "Fatigue_Failure #" may be stored so that this information can be read later, or this signal may be coupled to an external connection terminal such as a bond pad, or a solder bump. If the information is to be stored, this may be done in any type of storage mechanism, including but not limited to a latch circuit, a static memory cell, a dynamic memory cell, a non-volatile memory cell, and so on.

Figure 3:
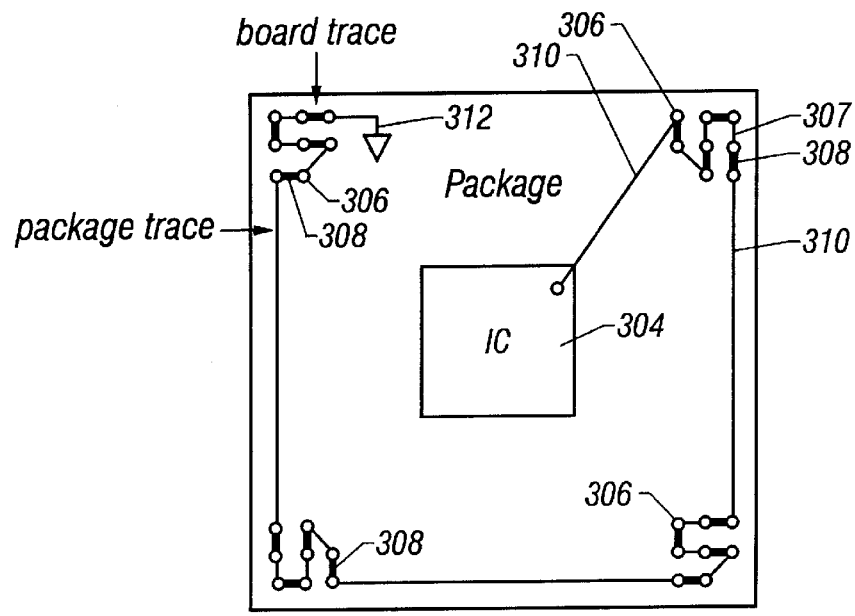
FIG. 3 is a top view of a solder fatigue test chain illustrating the interconnections between solder balls in a solder fatigue test chain in accordance with the present invention.

FIG. 3 shows an illustrative wiring configuration of the solder joint test chain. Solder joints, or solder balls, 306 in the corners of a package are often subject to the greatest stresses, thus these solder balls are used in the illustrative solder joint test chain to detect open solder joints. The solder joint test chain starts with one solder ball 306 (referred to herein as the far end) connected to the package ground plane 312. The board side of this solder ball is connected to the board side of an adjacent solder ball 306 by a board-side trace 308, indicated by the heavy lines in FIG. 3. The package side of this next solder ball is then connected to the package side of the next solder ball in the chain as shown in the figure by a package-side trace 307.

An even number of solder balls are included in the chain in each corner of the package. This ensures that long traces 310 that connect the corners of the package together are routed in the package itself. If traces 310 were routed on the board, they would consume valuable routing space.

Figure 4:
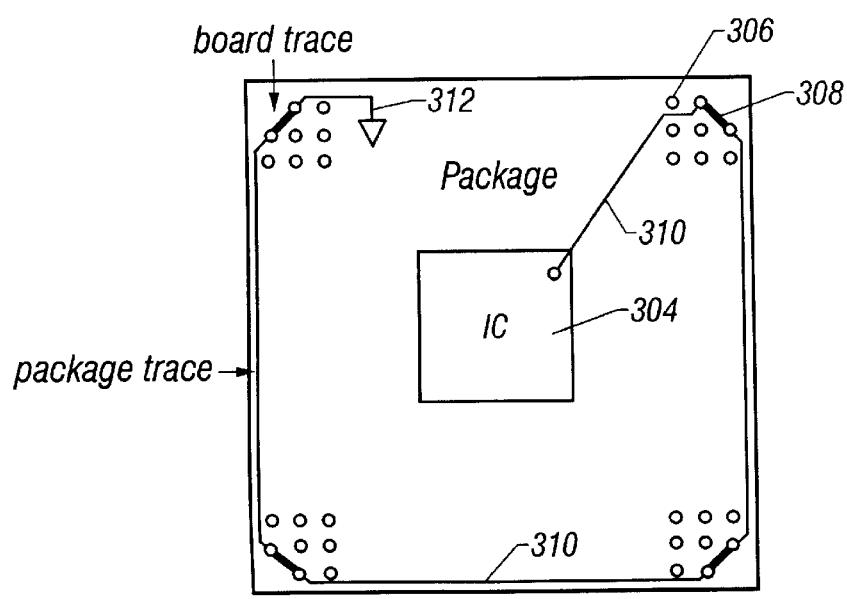
FIG. 4 is a top view of an alternative layout for a solder fatigue test chain illustrating the interconnections between solder balls in a solder fatigue test chain in accordance with the present invention.

FIG. 4 shows an alternative arrangement for wiring the solder test chain using a minimal number of solder balls. Although this arrangement uses fewer solder balls, it is not as sensitive a monitor for solder fatigue or other related failures as is the arrangement shown in FIG. 3.

Although the embodiments of the present invention described above relate to determining the presence of solder joint related problems found in package-to-board connections, it should be noted that similar embodiments of the present invention can also be used to determine the presence of solder joint related problems in the chip-to-package connections found in the silicon/package interface in a C4 packaging arrangement. The region where connection is established between the IC and the package may be referred to as an attachment interface.

Those skilled in the art and having the benefit of this disclosure will appreciate that alternative logic may be used to discern information from the state of the solder joint strings. For example, the far end of the solder fatigue test chain may be coupled to a positive voltage during testing, rather than ground, and therefore an NFET may be used to couple the sensing node to ground, and the gate of the NFET can be driven with the output of an OR gate.

Embodiments of the present invention may be used as part of a system-wide reliability check performed upon an electronic system. In such a configuration one or more integrated circuits embodying detection circuits, in lo accordance with the present invention, report their reliability status, based at least in part on determining whether solder joint failure has occurred, to a system management device or to a system user.

CONCLUSION

Embodiments of the present invention provide a warning in advance of system failure, permitting repair or replacement of a failing unit/joint before a failure becomes catastrophic.

Embodiments of the present invention include structures and circuitry that can determine whether solder joint failure has occurred, and that can communicate the occurrence of solder joint failure to other components or systems.

An advantage of the present invention is that a nondestructive test of an assembled package can determine whether solder joint failure has occurred.

It will be understood by those skilled in the art that many design choices are possible within the scope of the present invention. For example, embodiments of the present may include a plurality of solder joint test chains each covering a particular area of the attachment interface, regardless of whether the attachment interface is between chip and package, or between package and board. By including several solder joint test chains, each located at a different location it is possible to determine with the actual failure location with significant specificity.

It will be understood that various other changes in the details, materials, and arrangements of the parts and steps which have been described and illustrated may be made by those skilled in the art without departing from the principles and scope of the invention as expressed in the subjoined claims.

What is claimed is:

1. An apparatus comprising:
a plurality of contact areas, disposed in an integrated circuit package, which are disjointed segments of a solder joint test chain, in which some of the contact areas are coupled together by a plurality of conductive traces disposed in the integrated circuit package, said solder joint test chain formed when the integrated circuit package is coupled with a substrate through a plurality of solder balls, said solder joint test chain formed from the plurality of contact areas disposed in the integrated circuit package, the plurality of conductive traces disposed in the integrated circuit package, the plurality of solder balls, a plurality of contact areas disposed in the substrate, and a plurality of conductive traces disposed in the substrate; and
a sensing circuit coupled to one of the contact areas disposed in the integrated circuit package at one end of said solder joint test chain when said solder joint test chain is formed, said sensing circuit to detect a voltage that determines an electrical characteristic of said solder joint test chain when said solder joint test chain is formed.

2. The apparatus of claim 1, further comprising a source node coupled with a pull-up device, the pull-up device coupled to the one of the contact areas disposed in the integrated circuit package.

3. The apparatus of claim 1, wherein the substrate comprises a printed circuit board.

4. The apparatus of claim 1, wherein the sensing circuit comprises an inverter.

5. The apparatus of claim 4, wherein an output terminal of the inverter is coupled to a storage mechanism.

6. The apparatus of claim 4, further comprising an output terminal of the inverter coupled to a first input terminal of an AND gate, a control signal source coupled to a second input terminal of the AND gate, an output terminal of the AND gate coupled to a gate terminal of a transistor, an output signal from the AND gate to enable and disable the transistor to reduce power consumption.

7. The apparatus of claim 1, wherein the plurality of solder balls, when the solder joint test chain is formed, are positioned at the corners of the integrated circuit package.

8. The apparatus of claim 1, further comprising, when the solder joint test chain is formed, some of the contact areas disposed in the substrate are coupled together by the plurality of conductive traces disposed in the substrate.

9. The apparatus of claim 1, further comprising, when the solder joint test chain is formed, the contact areas disposed in the integrated circuit package are coupled with the contact areas disposed in the substrate through the plurality of solder balls.

10. An apparatus comprising:
a plurality of contact areas, disposed in an integrated circuit, which are disjointed segments of a solder joint test chain, in which some of the contact areas are coupled together by a plurality of conductive traces disposed in the integrated circuit, said solder joint test chain formed when the integrated circuit is coupled with a substrate through a plurality of solder bumps, said solder joint test chain formed from the plurality of contact areas disposed in the integrated circuit, the plurality of conductive traces disposed in the integrated circuit, the plurality of solder bumps, a plurality of contact areas disposed in the substrate, and a plurality of conductive traces disposed in the substrate; and
a sensing circuit coupled to one of the contact areas disposed in the integrated circuit at one end of said solder joint test chain when said solder joint test chain is formed, said sensing circuit to detect a voltage that determines an electrical characteristic of said solder joint test chain when said solder joint test chain is formed.

11. The apparatus of claim 10, further comprising a source node coupled with a pull-up device, the pull-up device coupled to the one of the contact areas disposed in the integrated circuit.

12. The apparatus of claim 10, wherein the substrate comprises an integrated circuit package.

13. The apparatus of claim 10, wherein the sensing circuit comprises an inverter.

14. The apparatus of claim 13, wherein an output terminal of the inverter is coupled to a storage mechanism.

15. The apparatus of claim 13, further comprising an output terminal of the inverter coupled to a first input terminal of an AND gate, a control signal source coupled to a second input terminal of the AND gate, an output terminal of the AND gate coupled to a gate terminal of a transistor, an output signal from the AND gate to enable and disable the transistor to reduce power consumption.

16. The apparatus of claim 10, wherein the plurality of solder bumps, when the solder joint test chain is formed, are positioned at the corners of the integrated circuit.

17. The apparatus of claim 10, further comprising, when the solder joint test chain is formed, some of the contact areas disposed in the substrate are coupled together by the plurality of conductive traces disposed in the substrate.

18. The apparatus of claim 10, further comprising, when the solder joint test chain is formed, the contact areas disposed in the integrated circuit are coupled with the contact areas disposed in the substrate through the plurality of solder bumps.

19. A method comprising:
sourcing a source voltage onto a solder joint test chain when said solder joint test chain is formed, said solder joint test chain formed when an integrated circuit package is coupled with a substrate through a plurality of solder balls, said solder joint test chain formed from a plurality of contact areas disposed in the integrated circuit package, a plurality of conductive traces disposed in the integrated circuit package, the plurality of solder balls, a plurality of contact areas disposed in the substrate, and a plurality of conductive traces disposed in the substrate; and
sensing a voltage, when said solder joint test chain is formed, at one of the plurality of contact areas disposed in the integrated circuit package at one end of said solder joint test chain, to non-destructively detect if an electrical characteristic of said solder joint test chain has changed, the voltage is determinative of the electrical characteristic of said solder joint test chain.

20. The method of claim 19, further comprising, when the solder joint test chain is formed, generating an output signal based on the voltage sensed at the one of the contact areas disposed in the integrated circuit package, the voltage indicating if the electrical characteristic of the solder joint test chain has changed.

21. The method of claim 19, wherein a change in the electrical characteristic of the solder joint test chain, when the solder joint test chain is formed, causes a change in the voltage at the one of the contact areas disposed in the integrated circuit package.

22. The method of claim 19, wherein the change in the voltage at the one of the contact areas disposed in the integrated circuit package, when the solder joint test chain is formed, indicates whether a solder joint failure has occurred.

23. The method of claim 22, wherein the solder joint failure, when the solder joint test chain is formed, is a result of a mechanical stress due to the different expansion rates associated with the integrated circuit package and the substrate.

24. A method comprising:
sourcing a source voltage onto a solder joint test chain when said solder joint test chain is formed, said solder joint test chain formed when an integrated circuit is coupled with a substrate through a plurality of solder bumps, said solder joint test chain formed from a plurality of contact areas disposed in the integrated circuit, a plurality of conductive traces disposed in the integrated circuit, the plurality of solder bumps, a plurality of contact areas disposed in the substrate, and a plurality of conductive traces disposed in the substrate; and
sensing a voltage, when said solder joint test chain is formed, at one of the plurality of contact areas disposed in the integrated circuit at one end of said solder joint test chain, to non-destructively detect if an electrical characteristic of said solder joint test chain has changed, the voltage is determinative of the electrical characteristic of said solder joint test chain.

25. The method of claim 24, further comprising, when the solder joint test chain is formed, generating an output signal based on the voltage sensed at the one of the contact areas disposed in the integrated circuit, the voltage indicating if the electrical characteristic of the solder joint test chain has changed.

26. The method of claim 24, wherein a change in the electrical characteristic of the solder joint test chain, when the solder joint test chain is formed, causes a change in the voltage at the one of the contact areas disposed in the integrated circuit.

27. The method of claim 24, wherein the change in the voltage at the one of the contact areas disposed in the integrated circuit, when the solder joint test chain is formed, indicates whether a solder joint failure has occurred.

28. The method of claim 27, wherein the solder joint failure, when the solder joint test chain is formed, is a result of a mechanical stress due to the different expansion rates associated with the integrated circuit and the substrate.

* * * * *